(12) United States Patent
Li

(10) Patent No.: US 10,340,387 B2
(45) Date of Patent: Jul. 2, 2019

(54) LOW TEMPERATURE POLY-SILICON THIN FILM TRANSISTOR, MANUFACTURING METHOD THEREOF, AND ARRAY SUBSTRATE

(71) Applicant: Wuhan China Star Optoelectronics Semiconductor Display Technology Co., Ltd., Wuhan, Hubei (CN)

(72) Inventor: Songshan Li, Guangdong (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 15/745,073

(22) PCT Filed: Dec. 18, 2017

(86) PCT No.: PCT/CN2017/116852
§ 371 (c)(1),
(2) Date: Jan. 15, 2018

(87) PCT Pub. No.: WO2019/056622
PCT Pub. Date: Mar. 28, 2019

(65) Prior Publication Data
US 2019/0088786 A1    Mar. 21, 2019

(30) Foreign Application Priority Data

Sep. 20, 2017    (CN) .......................... 2017 1 0853687

(51) Int. Cl.
*H01L 21/02*      (2006.01)
*H01L 27/12*      (2006.01)
(Continued)

(52) U.S. Cl.
CPC .. *H01L 29/78618* (2013.01); *H01L 21/02532* (2013.01); *H01L 21/02592* (2013.01);
(Continued)

(58) Field of Classification Search
CPC ... H01L 29/786; H01L 21/336; H01L 21/311; H01L 21/77; H01L 21/31116;
(Continued)

(56) References Cited

U.S. PATENT DOCUMENTS 6,528,820 B1 * 3/2003 Yamazaki ........... H01L 21/2022
  257/66
7,176,074 B1 * 2/2007 Shiau ................ H01L 21/31144
  257/E21.257
(Continued)

FOREIGN PATENT DOCUMENTS

| CN | 1531112 A | 9/2004 |
|---|---|---|
| CN | 104701255 A | 6/2015 |
| CN | 106952798 A | 7/2017 |

*Primary Examiner* — Alexander O Williams
(74) *Attorney, Agent, or Firm* — Hauptman Ham, LLP

(57) ABSTRACT

A manufacturing method of a LTPS-TFT is provided, including: providing a substrate, sequentially forming a buffer layer, a low temperature poly-silicon layer, a source contact region, a drain contact region, a gate insulator layer, a gate layer, and a dielectric layer on the substrate, respectively forming a first and a second contact holes through the dielectric layer and the gate insulator layer by dry etching to expose the source and the drain contact regions; and on the dielectric layer, forming a source electrode to contact the source contact region through the first contact hole and a drain electrode to contact the drain contact region through the second contact hole. A LTPS-TFT and an array substrate are also provided.

10 Claims, 3 Drawing Sheets

(51) Int. Cl.
*H01L 27/32* (2006.01)
*H01L 29/49* (2006.01)
*H01L 29/66* (2006.01)
*H01L 21/311* (2006.01)
*H01L 21/768* (2006.01)
*H01L 29/417* (2006.01)
*H01L 29/423* (2006.01)
*H01L 29/786* (2006.01)

(52) U.S. Cl.
CPC .. *H01L 21/02675* (2013.01); *H01L 21/31116* (2013.01); *H01L 21/76805* (2013.01); *H01L 21/76895* (2013.01); *H01L 27/1222* (2013.01); *H01L 27/1274* (2013.01); *H01L 29/41733* (2013.01); *H01L 29/42384* (2013.01); *H01L 29/4908* (2013.01); *H01L 29/66757* (2013.01); *H01L 29/78675* (2013.01); *H01L 27/3262* (2013.01)

(58) Field of Classification Search
CPC ......... H01L 27/12; H01L 29/49; H01L 29/45; H01L 21/30; H01L 21/02; H01L 21/266; H01L 21/66; H01L 29/66; H01L 29/423; H01L 27/1274; H01L 27/1222; H01L 27/1288; H01L 29/66757; H01L 29/66765; H01L 29/4908; H01L 29/78645
USPC .......................................................... 257/72
See application file for complete search history.

(56) References Cited

U.S. PATENT DOCUMENTS

| | | | |
|---|---|---|---|
| 10,038,100 B2 * | 7/2018 | Yamazaki | H01L 27/1225 |
| 2005/0019996 A1 | 1/2005 | Tsao | |
| 2009/0203177 A1 * | 8/2009 | Mitsuhashi | H01L 29/41783 |
| | | | 438/166 |
| 2010/0006847 A1 * | 1/2010 | Hu | H01L 21/2652 |
| | | | 257/66 |
| 2011/0101333 A1 * | 5/2011 | Shionoiri | H01L 21/76254 |
| | | | 257/43 |
| 2015/0206905 A1 * | 7/2015 | Wang | H01L 29/78621 |
| | | | 257/72 |
| 2015/0294869 A1 * | 10/2015 | Mao | H01L 29/66757 |
| | | | 438/155 |
| 2016/0020333 A1 * | 1/2016 | Gao | H01L 29/78678 |
| | | | 257/71 |
| 2016/0043141 A1 * | 2/2016 | Nishihara | H01L 27/2463 |
| | | | 257/4 |
| 2016/0197197 A1 * | 7/2016 | Jo | H01L 29/78675 |
| | | | 257/72 |
| 2016/0276488 A1 * | 9/2016 | Yamazaki | H01L 29/7869 |
| 2016/0284823 A1 * | 9/2016 | Yamazaki | H01L 29/66969 |
| 2017/0110488 A1 * | 4/2017 | Sun | H01L 27/1274 |
| 2017/0236949 A1 * | 8/2017 | Yamazaki | H01L 27/1225 |
| | | | 257/43 |
| 2018/0033808 A1 * | 2/2018 | Li | H01L 21/02532 |
| 2018/0061867 A1 * | 3/2018 | Chang | H01L 27/1225 |
| 2019/0024227 A1 * | 1/2019 | Yamazaki | C23C 14/08 |

* cited by examiner

LOW TEMPERATURE POLY-SILICON THIN FILM TRANSISTOR, MANUFACTURING METHOD THEREOF, AND ARRAY SUBSTRATE

RELATED APPLICATIONS

The present application is a National Phase of International Application Number PCT/CN2017/116852, filed Dec. 18, 2017, and claims the priority of China Application No. 201710853687.7, filed Sep. 20, 2017.

FIELD OF THE DISCLOSURE

The disclosure relates to the field of display, in particular to a low temperature poly-silicon thin film transistor, manufacturing method thereof, and array substrate.

BACKGROUND

At present, in the conventional manufacturing process of low temperature poly-silicon thin film transistor (LTPS-TFT), a contact hole configured to connect the source/drain (SD) and low temperature poly-silicon may be fabricated by a dry etching process. The dry etching gas generally uses $CF_4$ or $SF_6$, but the selectivity of the two gases to poly-silicon (Poly-Si) is not good, but an etch rate of the two gases to Poly-Si is relatively large, easily leading to greater loss of Poly-Si and affecting the ohmic contact between SD and Poly-Si, thereby affecting the electrical properties of the thin film transistor and even leading to the phenomenon of current crowded. Liquid crystal displays are widely applied due to numerous advantages such as thin bodies, energy saving, radiation-free, etc. Most liquid crystal displays available on the market are backlight-type liquid crystal displays, and such liquid crystal display includes a liquid crystal panel and a backlight module. The working principle of the liquid crystal panel is placing liquid crystal molecules between two parallel glass substrates and loading a driving voltage on the two glass substrates to control rotation directions of the liquid crystal molecules, for refracting rays of the backlight module to generate images.

SUMMARY

The embodiment of the disclosure provides a low temperature poly-silicon thin film transistor, a manufacturing method thereof, and an array substrate, configured to reduce poly-silicon loss in a dry etching process.

A first aspect of the embodiments of the disclosure provides a manufacturing method of a low temperature poly-silicon thin film transistor, including:

providing a substrate and sequentially forming a buffer layer, a low temperature poly-silicon layer, a source contact region, a drain contact region, a gate insulator layer, a gate layer, and a dielectric layer on the substrate, and the source contact region and the drain contact region are disposed in a same layer as the low temperature poly-silicon layer and are respectively disposed at two opposite ends of the low temperature poly-silicon layer;

respectively forming a first contact hole and a second contact hole through the dielectric layer and the gate insulator layer by dry etching to expose the source contact region and the drain contact region respectively; and an etching gas used in the dry etching includes a fluorine-containing gas and a hydrogen gas; and forming a source electrode on the dielectric layer to contact the source contact region through the first contact hole and a drain electrode on the dielectric layer to contact the drain contact region through the second contact hole.

The fluorine-containing gas includes at least one of $CF_4$ and $SF_6$.

A flow ratio of the fluorine-containing gas to the hydrogen gas is 5-15:1.

A flow ratio of the fluorine-containing gas to the hydrogen gas is 10:1.

A flow rate of the fluorine-containing gas ranges from 100 to 500 sccm.

In the dry etching process, a pressure is in a range of 30-50 mtorr, a gas source power is in a range of 400-800 W, and a bias voltage is in a range of 100-200 V.

A material of the gate insulator layer includes at least one of silicon nitride and silicon oxide, and the gate insulator layer has a thickness of 1000-2000 Å; and the material of the dielectric layer includes at least one of silicon nitride and silicon oxide, and the dielectric layer has a thickness of 2000-5000 Å.

A second aspect of the embodiments of the disclosure provides a low temperature poly-silicon thin film transistor, and the low temperature poly-silicon thin film transistor is manufactured by the manufacturing method of the low temperature poly-silicon thin film transistor as described above.

The source contacts a surface of the low temperature poly-silicon layer away from the buffer layer in the source contact region, and the drain electrode contacts a surface of the low temperature poly-silicon layer away from the buffer layer in the drain contact region.

A third aspect of the embodiments of the disclosure provides an array substrate, including the low temperature poly-silicon thin film transistor as described above.

The disclosure has the following beneficial effects:

in the method for manufacturing a low temperature poly-silicon thin film transistor provided by the disclosure, when a contact hole is manufactured by a dry etching process, adding a certain amount of $H_2$, and $H_2$ can suppress the fluorine-containing gas such as $CF_4$ or $SF_6$ to etch the underlying poly-silicon, so the etching rate of $CF_4$ or $SF_6$ to poly-silicon is small, and the selectivity thereof to poly-silicon is increased, resulting in less poly-silicon loss, so as to make the source/drain form a good ohmic contact with the surface of the low temperature poly-silicon layer, thereby improving the electrical properties of the thin film transistor greatly.

BRIEF DESCRIPTION OF THE DRAWINGS

In order to illustrate technical schemes of the disclosure or the prior art more clearly, the following section briefly introduces drawings used to describe the embodiments and prior art. Obviously, the drawing in the following descriptions is just some embodiments of the disclosure. The ordinary person in the related art can acquire the other drawings according to these drawings without offering creative effort.

DETAILED DESCRIPTION OF PREFERRED EMBODIMENTS

The following is a preferred embodiment of the disclosure, and it should be indicated that the disclosure can also be improved and modified by those skilled in the art without departing from the principle of the disclosure, and these improvements and modifications also fall within the protection scope of the claims of the disclosure.

Figure 1:
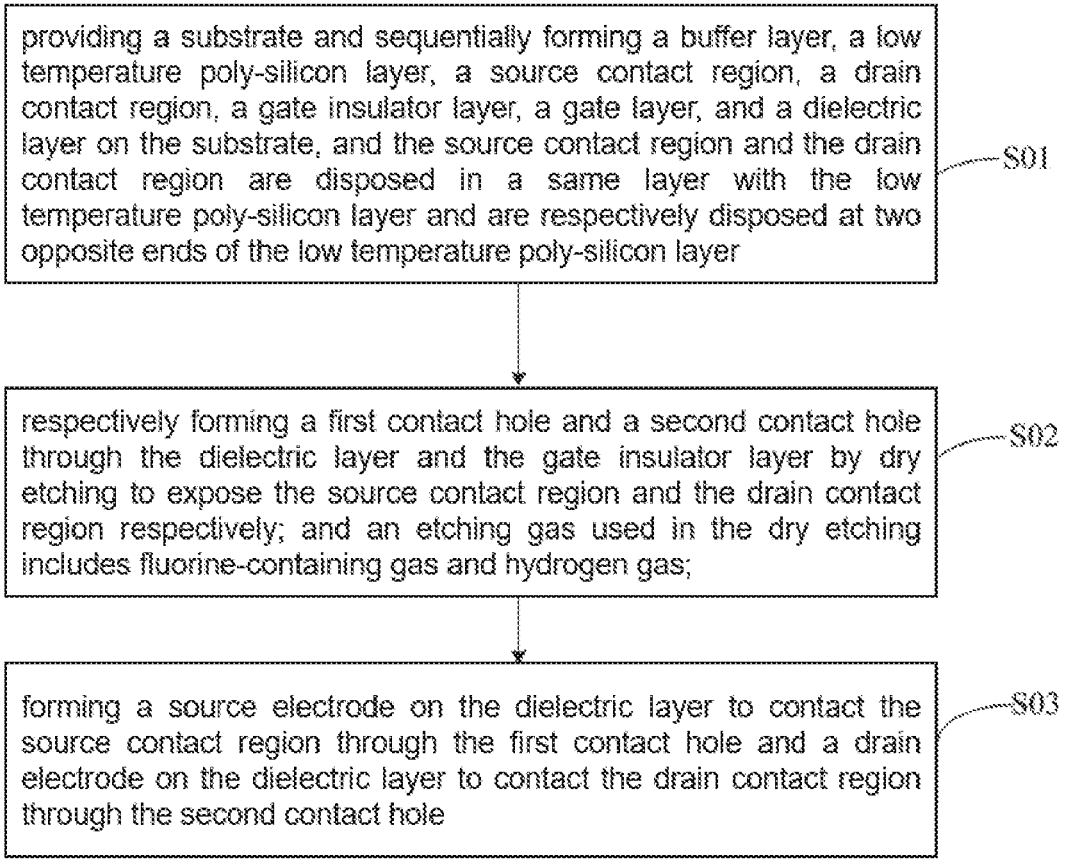
FIG. 1 is a flowchart of a manufacturing method of a low temperature poly-silicon thin film transistor according to an embodiment of the disclosure.
Figure 2:
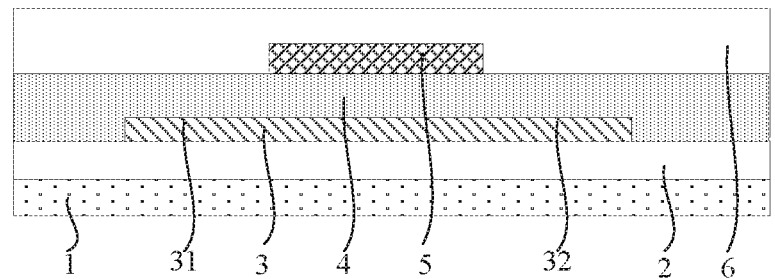
FIG. 2 is a schematic diagram of a substrate where a buffer layer, a low temperature poly-silicon layer, a gate insulator layer, a gate layer, and a dielectric layer are formed in step S01.
Figure 3:
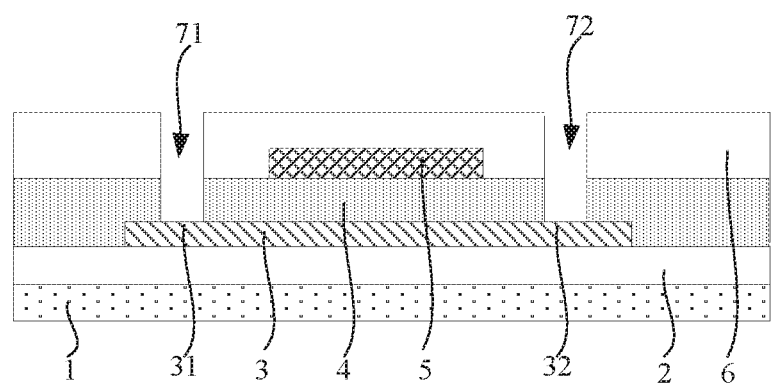
FIG. 3 is a schematic diagram of a structure of a substrate where a first contact hole and a second contact hole are formed in the step S02.
Figure 4:
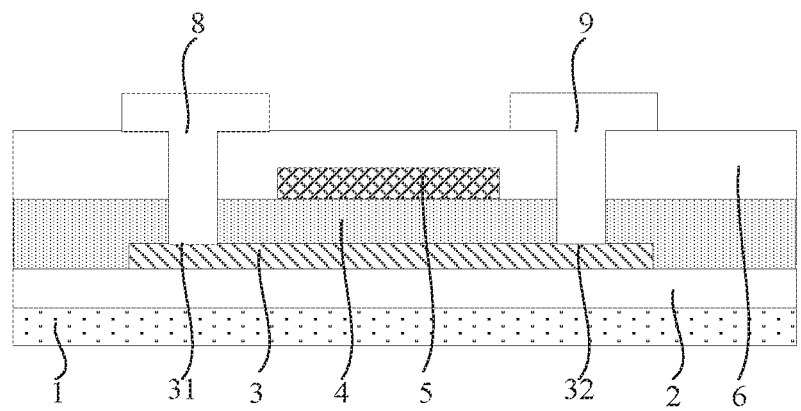
FIG. 4 is a schematic diagram of the structure of the substrate where a source electrode and a drain electrode are formed in step S03.

Referring to FIGS. 1 to 4, FIG. 1 is a flowchart of a manufacturing method of a low temperature poly-silicon thin film transistor according to an embodiment of the disclosure; FIG. 2 is a schematic diagram of a substrate where a buffer layer, a low-temperature poly-silicon layer, a gate insulator layer, a gate layer, and a dielectric layer are formed in step S01; FIG. 3 is a schematic diagram of a structure of a substrate where a first contact hole and a second contact hole are formed in the step S02; FIG. 4 is a schematic diagram of the structure of the substrate where a source electrode and a drain electrode are formed in step S03; a first aspect of the embodiments of the disclosure provides a manufacturing method of a low temperature poly-silicon thin film transistor, including:

S01: providing a substrate 1, sequentially forming a buffer layer 2, a low temperature poly-silicon layer 3, a source contact region 31, a drain contact region 32, a gate insulator layer 4, a gate layer 5, and a dielectric layer 6 on the substrate 1, and the source contact region 31 and the drain contact region 32 are disposed in a same layer as the low temperature poly-silicon layer 3, and are respectively disposed at two opposite ends of the low temperature poly-silicon layer 3;

In this embodiment, when the cleanliness of the substrate 1 does not meet the requirement, the substrate 1 is firstly pre-washed. Optionally, the material of the substrate 1 is not limited, and may be a glass substrate, a flexible substrate, or the like.

In the present embodiment, a buffer layer 2 covering the entire substrate is formed on the substrate 1 by a coating process such as plasma enhanced chemical vapor deposition (PECVD). Optionally, the material of the buffer layer 2 includes at least one of silicon nitride and silicon oxide. Further optionally, the material of the buffer layer 2 may be a single-layer silicon oxide ($SiO_x$) film or a silicon nitride ($SiN_x$) film, or a laminate of $SiO_x$ and $SiN_x$. Preferably, the material of the buffer layer 2 is a laminated material formed of $SiO_x$ and $SiN_x$.

In this embodiment, an amorphous silicon layer is deposited on the buffer layer 2 by a coating process such as PECVD. A portion of the buffer layer covers the amorphous silicon layer, and the amorphous silicon layer is annealed so as to convert the amorphous silicon layer into a low temperature poly-silicon layer 3. Specifically, the amorphous silicon crystal is converted into poly-silicon by an excimer laser annealing (ELA) process, and then the poly-silicon is patterned to form the low temperature poly-silicon layer 3. Specifically, the amorphous silicon layer can be patterned by a photolithographic process. Optionally, the source contact region 31 and the drain contact region 32 are disposed in the same layer with the low temperature poly-silicon layer 3 and are respectively disposed at two opposite ends of the low temperature poly-silicon layer 3.

In the present embodiment, a gate insulator (GI) layer 4 is deposited on the low temperature poly-silicon layer 3 by a coating process, the gate insulator layer 4 completely covers the low temperature poly-silicon layer 3 and a region of the buffer layer 2 not covered by the low temperature poly-silicon layer 3. Optionally, a material of the gate insulator layer 4 includes at least one of silicon nitride and silicon oxide. Further optionally, the material of the gate insulator layer 4 may be a single layer of $SiN_x$ or a single layer of $SiO_x$, or a laminated layer of $SiO_x$ and $SiN_x$. Preferably, the material of the gate insulator layer 4 is silicon oxide. Optionally, the gate insulator layer 4 has a thickness of 1000-2000 Å. Specifically, the gate insulating layer 4 may has a thickness of 1000 Å, 1200 Å, 1500 Å, 1700 Å, or 2000 Å.

In the present embodiment, the gate layer 5 is deposited on the gate insulator layer 4 by physical vapor deposition (PVD), and the gate layer 5 covers a portion of the gate insulator layer 4. Optionally, the gate material layer 5 may be a metal or alloy, and the metal or alloy layer may be formed of molybdenum (Mo), aluminum (Al), copper (Cu), and tungsten (W) or at least two alloys of molybdenum (Mo), aluminum (Al), copper (Cu), and tungsten (W). Preferably, the material of the gate layer 5 is Mo.

In the present embodiment, the low temperature poly-silicon layer 3 is ion-doped with the gate layer 5 as a mask to form an ohmic contact region in the low temperature poly-silicon layer that can be in contact with the source/drain electrode, that is, form a source contact region 31 and a drain contact region 32. The doped ions may be, but not limited to, boron (B) ions.

In the present embodiment, by the coating process such as PECVD, a dielectric layer 6 is covered on the gate layer 5 and a region of the gate insulator layer 4 not covered with the gate layer 5 and then is annealed rapidly for activation by a rapid thermal annealing (RTA) process. Optionally, a material of the dielectric layer 6 includes at least one of $SiN_x$ and $SiO_x$. Further optionally, the material of the dielectric layer 6 may be a single layer of $SiN_x$ or a single layer of $SiO_x$, or a laminated layer of $SiO_x$ and $SiN_x$. Preferably, the material of the dielectric layer 6 is a laminated material formed of $SiO_x$ and $SiN_x$. Optionally, the dielectric layer 6 has a thickness of 2000-5000 Å. Specifically, the dielectric layer 6 may has a thickness of 2000 Å, 2500 Å, 3000 Å, 3500 Å, 4000 Å, 4500 Å, or 5000 Å.

S02: forming a first contact hole 71 and a second contact hole 72 through the dielectric layer 6 and the gate insulator layer 4 respectively by dry etching to expose the source contact region 31 and the drain contact region 32 respectively; and the etching gas used for dry etching includes a fluorine-containing gas and a hydrogen gas.

In this embodiment, the etching gas used in the dry etching process includes fluorine-containing gas and hydrogen gas. Optionally, the fluorine-containing gas includes at least one of $CF_4$ and $SF_6$. Optionally, the etch gas includes $CF_4$ and $SF_6$, or includes $SF_6$ and hydrogen. Optionally, the flow ratio of the fluorine-containing gas to the hydrogen gas is 5-15:1. Further optionally, the flow ratio of the fluorine-containing gas to the hydrogen gas is 10:1. Optionally, the flow rate of the fluorine-containing gas is 100-500 sccm.

Specifically, the flow rate of the fluorine-containing gas may be 100 sccm, 200 sccm, 300 sccm, 400 sccm, or 500 sccm. 1 sccm is defined as a flow measurement term of 1 cubic centimeter per minute (1 ml/min) in the standard state, that is, at 1 atmosphere, 25 degrees Celsius. Optionally, in the dry etching process, a pressure is in a range of 30-50 mtorr, a gas source power is in a range of 400-800 W, and a bias voltage is in a range of 100-200 V. Specifically, the gas pressure may be 30 mtorr, 35 mtorr, 40 mtorr, 45 mtorr, or 50 mtorr. The gas source power can be 400 W, 500 W, 600 W, 700 W, or 800 W. The bias voltage can be 100 V, 120 V, 150 V, or 200 V. Optionally, the etching time is selected according to the thickness of the dielectric layer and the gate insulator layer and the flow rate of the etching gas. Specifically, the etching gas forms the isotropic plasma after the plasmaization process, and the plasma performs dry etching on the dielectric layer and the gate insulator layer. More specifically, the isotropic plasma is prepared by using the plasma generator under the conditions that the pressure is 30-50 mtorr, a gas source power is 400-800 W and a bias voltage is 100-200 V. Optionally, the plasma generator is any one of a decoupled capacitively coupled plasma (CCP) generator, a transformer coupled plasma (TCP) generator, or an inductively coupled plasma (ICP) generator.

S03: forming a source electrode 8 on the dielectric layer 6 to contact the source contact region 31 through the first contact hole 71 and forming a drain electrode 9 on the dielectric layer 6 to contact the drain contact region 32 through the second contact hole 72.

In this embodiment, the source electrode 8 and the drain electrode 9 are deposited using a physical vapor deposition (PVD) process. Optionally, the material of the source electrode 8 and the drain electrode 9 includes but is not limited to one or more of metal materials such as Al, Mo, Cu, Ag, Cr, Ti, AlNi, and MoTi. Optionally, the material of the source electrode 8 and the drain electrode 9 may be a laminated composite material of Mo/Al/Mo.

A second aspect of the embodiments of the disclosure provides a low temperature poly-silicon thin film transistor, which is manufactured by the manufacturing method of a low temperature poly-silicon thin-film transistor described in the first aspect. A structure of the low temperature poly-silicon thin film transistor may refer to the structure of the low temperature poly-silicon thin film transistor shown in FIG. 4.

In an embodiment of the disclosure, the source electrode contacts a surface of the low temperature poly-silicon layer away from the buffer layer in the source contact region, and the drain electrode contacts a surface of the low temperature poly-silicon layer away from the buffer layer in the drain contact region. In this embodiment of the disclosure, a certain amount of $H_2$ is added to the etching gas in the dry etching process, and $H_2$ can suppress the fluorine-containing gas such as $CF_4$ or $SF_6$ to etch the underlying poly-silicon, resulting in less poly-silicon loss, so as to make the source/drain form a good ohmic contact with the surface of the low temperature poly-silicon layer, thereby improving the electrical properties of the thin film transistor greatly.

A third aspect of the embodiments of the disclosure provides an array substrate, which includes the low temperature poly-silicon thin film transistor.

Figure 5:
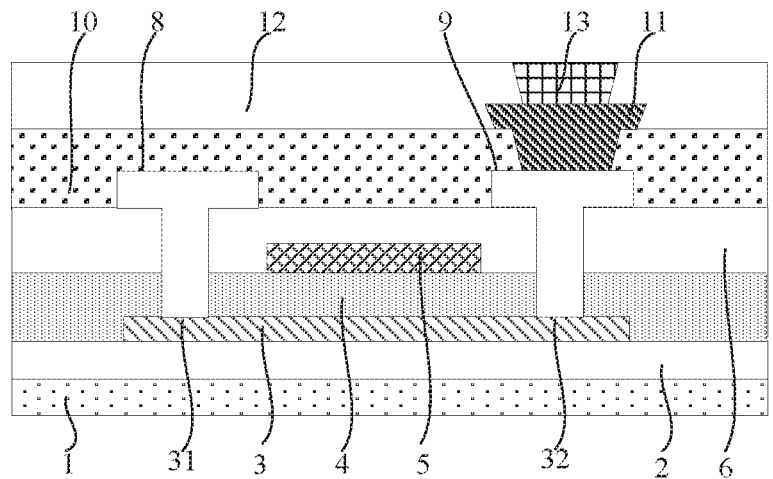
FIG. 5 is a schematic structural diagram of an array substrate according to an embodiment of the disclosure.

Referring to FIG. 5, in this embodiment, the array substrate further includes a planarization layer (PLN) 10, an anode 11, and a pixel definition layer 12 located on the low temperature poly-silicon thin film transistor, and the planarization layer includes a via hole, the anode 11 is electrically connected with the drain electrode 9 in the low temperature poly-silicon thin film transistor through the via hole; the pixel definition layer 12 is disposed on the planarization layer 10, and the pixel definition layer 12 includes an opening configured to expose a portion of the anode 11, and the opening is configured to dispose the OLED 13 connected to the anode 11.

Specifically, after the low temperature poly-silicon thin film transistor is manufactured, a planarization layer 10 is formed on the drain electrode 8 and the drain electrode 9 by a deposition and patterning process, and the planarization layer 10 includes a via hole configured to expose the drain electrode 9; then an anode 11 is formed at the via hole by a deposition and patterning process so as to make the anode 11 and the drain electrode 9 are electrically connected to each other; and pixel definition layer 12 is formed on the planarization layer 10 and the anode 11, an opening is formed on the pixel definition layer 12 to expose a portion of the anode 11, finally an organic light-emitting material of an organic light-emitting diode (OLED) is evaporated at the opening for connecting to the anode 11 to complete the fabrication of the OLED device. Optionally, a material of the planarization layer 10 is an organic insulating material. Further optionally, the material of the planarization layer 10 is polyimide. Optionally, the anode 11 may be made of materials such as indium tin oxide (ITO), indium zinc oxide (IZO), or aluminum zinc oxide. Optionally, the material of the pixel definition layer 12 may be a polyimide material.

Figure 6:
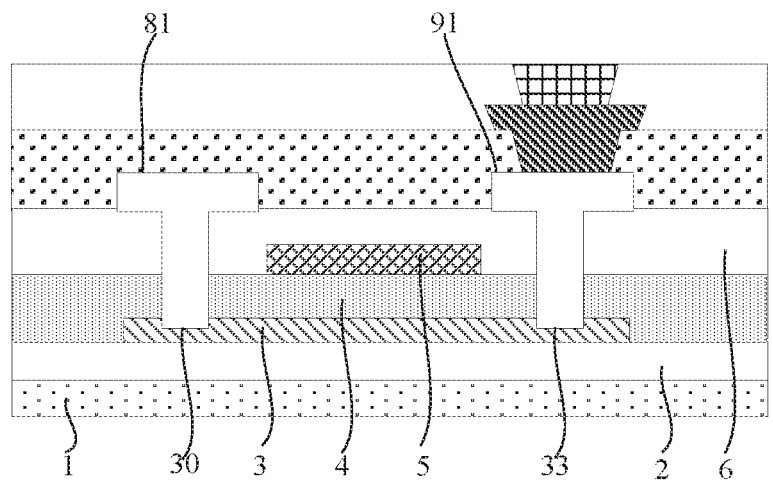
FIG. 6 is a schematic structural diagram of a low temperature poly-silicon thin film transistor manufactured by the dry etching process of the prior art.

FIG. 6 is a schematic structural diagram of a low temperature poly-silicon thin film transistor manufactured by the dry etching process of the prior art. It is found by contrast that when the contact hole is manufactured by using the etching gas of the prior art, more poly-silicon is etched away. When the source/drain is deposited, the source electrode 81 and the drain electrode 91 penetrate into the interior of the low temperature poly-silicon layer 3 to contact the source contact region 30 and the drain contact region 33, affecting the ohmic contact of the source/drain electrode with the poly-silicon. And in the low temperature poly-silicon thin film transistor provided in the embodiments of the disclosure, the source/drain electrode forms a good ohmic contact with the surface of the low temperature poly-silicon layer.

In the manufacturing method of a low temperature poly-silicon thin film transistor provided in the embodiments of the disclosure, when a contact hole is manufactured by a dry etching process, a certain amount of $H_2$ is added to the etching gas in the dry etching process, $H_2$ can suppress the fluorine-containing gas such as $CF_4$ or $SF_6$ to etch the underlying poly-silicon, so the etching rate of $CF_4$ or $SF_6$ to poly-silicon is small, and selectivity thereof to poly-silicon is increased, resulting in less poly-silicon loss, so as to make the source/drain form a good ohmic contact with the surface of the low temperature poly-silicon layer, thereby improving the electrical properties of the thin film transistor greatly.

Comparative Example 1

In order to highlight the beneficial effects of the embodiments of the disclosure, the contact hole is manufactured by the process of the prior art (that is, Comparative Example 1), that is, the etching gas is $CF_4$ or $SF_6$, excluding hydrogen gas, and other parameters such as gas flow rate and related parameters is the same as that in the steps S01 to S03 of the embodiment of the disclosure, and finally a low temperature poly-silicon thin film transistor is obtained.

Comparison shows that the etching gas of Comparative Example 1 does not use $H_2$, the measured contact resistance Rc between SD and the poly-silicon in the low temperature poly-silicon thin film transistor is about 4000Ω, and in the disclosure, the contact resistance Rc between SD and the poly-silicon in the low temperature poly-silicon thin film transistor is about 30Ω, indicating that SD and poly-silicon in the low temperature poly-silicon thin film transistor obtained in the embodiments of the disclosure can form a good ohmic contact.

Above are only embodiments of the disclosure, is not patented and therefore limit the scope of the disclosure. It should be indicated that the disclosure can also be improved and modified by those skilled in the art without departing from the principle of the disclosure, and these improvements and modifications also fall within the protection scope of the claims of the disclosure. Accordingly, the scope of protection of the disclosure is subject to the scope of protection of the claims.

What is claimed is:

1. A manufacturing method of a low temperature poly-silicon thin film transistor, comprising:
   providing a substrate and sequentially forming a buffer layer, a low temperature poly-silicon layer, a source contact region, a drain contact region, a gate insulator layer, a gate layer, and a dielectric layer on the substrate, wherein the source contact region and the drain contact region are disposed in a same layer as the low temperature poly-silicon layer and are respectively disposed at two opposite ends of the low temperature poly-silicon layer;
   respectively forming a first contact hole and a second contact hole through the dielectric layer and the gate insulator layer by dry etching to expose the source contact region and the drain contact region respectively; wherein an etching gas used in the dry etching comprises a fluorine-containing gas and a hydrogen gas; and
   forming a source electrode on the dielectric layer to contact the source contact region through the first contact hole and a drain electrode on the dielectric layer to contact the drain contact region through the second contact hole;
   wherein during the dry etching, a pressure is in a range of 30-50 mtorr, a gas source power is in a range of 400-800 W, and a bias voltage is in a range of 100-200 V.

2. The manufacturing method of the low temperature poly-silicon thin film transistor according to claim 1, wherein the fluorine-containing gas comprises at least one of $CF_4$ and $SF_6$.

3. The manufacturing method of the low temperature poly-silicon thin film transistor according to claim 1, wherein a flow ratio of the fluorine-containing gas to the hydrogen gas is 5-15:1.

4. The manufacturing method of the low temperature poly-silicon thin film transistor according to claim 3, wherein the flow ratio of the fluorine-containing gas to the hydrogen gas is 10:1.

5. The manufacturing method of the low temperature poly-silicon thin film transistor according to claim 1, wherein a flow rate of the fluorine-containing gas is from 100 to 500 sccm.

6. The manufacturing method of the low temperature poly-silicon thin film transistor according to claim 1, wherein a material of the gate insulator layer comprises at least one of silicon nitride and silicon oxide, and the gate insulator layer has a thickness of 1000-2000 Å; wherein a material of the dielectric layer comprises at least one of silicon nitride and silicon oxide, and the dielectric layer has a thickness of 2000-5000 Å.

7. A low temperature poly-silicon thin film transistor, wherein the low temperature poly-silicon thin film transistor is manufactured by the manufacturing method of the low temperature poly-silicon thin film transistor according to claim 1.

8. The low temperature poly-silicon thin film transistor according to claim 7, wherein the source electrode contacts a surface of the low temperature poly-silicon layer away from the buffer layer in the source contact region, and the drain electrode contacts a surface of the low temperature poly-silicon layer away from the buffer layer in the drain contact region.

9. An array substrate, comprising the low temperature poly-silicon thin film transistor according to claim 7.

10. The array substrate according to claim 9, wherein the source electrode contacts a surface of the low temperature poly-silicon layer away from the buffer layer in the source contact region, and the drain electrode contacts a surface of the low temperature poly-silicon layer away from the buffer layer in the drain contact region.

* * * * *